United States Patent [19]

Keum et al.

[11] Patent Number: 5,793,320
[45] Date of Patent: Aug. 11, 1998

[54] DIGITAL DATA LEVEL CONTROL CIRCUIT

[75] Inventors: Dong-jun Keum; Jin-sub Choi, both of Pucheon; Duck-young Jung, Incheon, all of Rep. of Korea

[73] Assignee: Samsung Electronics, Co, Ltd., Suwon, Rep. of Korea

[21] Appl. No.: 764,791

[22] Filed: Dec. 12, 1996

[30] Foreign Application Priority Data

Dec. 14, 1995 [KR] Rep. of Korea ............... 1995 49712

[51] Int. Cl.$^6$ .................................................. H03M 1/66
[52] U.S. Cl. .................................................. 341/144
[58] Field of Search .................................. 341/144, 131, 341/118, 146, 153, 154

[56] References Cited

U.S. PATENT DOCUMENTS 5,355,134 10/1994 Kasuga et al. ..................... 341/144

Primary Examiner—Brian K. Young
Attorney, Agent, or Firm—Marger, Johnson, McCollom,& Stolowitz P.C.

[57] ABSTRACT

A digital data level control circuit adopting a digital-to-analog conversion control mode is provided, in which a capacitor for removing popcorn (POP) noise is used towards an output end of a digital-to-analog converter portion and switching of a controller is controlled by a microcomputer to perform a desired level control, thereby effectively removing the POP noise. The digital data level control circuit includes a digital-to-analog converter portion for converting the digital data into analog data, a controller connected to an output end of the digital-to-analog converter portion, for controlling the level of the analog-converted data, and an out level control portion connected to one end of the controller, for smoothly controlling the level of the analog-converted output from the digital-to-analog converter portion. The output level control device as a capacitor controls the level of the output thereof by a time constant obtained from the resistance of a resistor and the capacitance of the capacitor within the controller.

12 Claims, 3 Drawing Sheets 5,793,320

1

DIGITAL DATA LEVEL CONTROL CIRCUIT

BACKGROUND OF THE INVENTION

The present invention relates to a digital data level control circuit, and more particularly, to a digital data level control circuit using only one capacitor at an output end of a digital-to-analog (D/A) converter.

There are generally two methods for controlling the levels of adjustable parameters such as volume, tone, balance, etc., responsive to digital data: 1) in a digital control mode in which the level of a parameter is directly controlled, and 2) in a digital-to-analog conversion control mode in which the level of the parameter is controlled by converting the digital data into an analog data.

The digital control mode has an advantage in that the system construction is simple. However, the process of the digital control mode should be a BICMOS or CMOS process, and it is difficult to remove popcorn (POP) noise generated during level control. On the contrary, the digital-to-analog conversion control mode can easily remove the POP noise generated during the level control by adopting a low pass filter and capacitors at an output end of a digital-to-analog converter (DAC), irrespective of the process. However, when the levels of several parameters must be controlled, the number of capacitors required for removing the POP noise increases. A separate capacitor is required for each parameter.

SUMMARY OF THE INVENTION

To solve the defects of the conventional circuit, it is an object of the present invention to provide a digital data level control circuit adopting a digital-to-analog conversion control mode, which can effectively remove popcorn (POP) noise with a simple structure having only one capacitor for removing the POP noise at an output end of a multiple-channel digital-to-analog converter (DAC) portion.

To achieve the above object, there is provided a digital data level control circuit adopting a digital-to-analog conversion control mode for controlling the level of a parameter using a microcomputer, the digital data level control circuit comprising: digital-to-analog converter means for converting the digital data into analog data; a controller connected to an output end of the digital-to-analog converter means, for controlling the level of the analog-converted data; and out level control means connected to one end of the controller, for smoothly controlling the level of the analog-converted output from the digital-to-analog converter means.

BRIEF DESCRIPTION OF THE DRAWINGS

The above object and advantages of the present invention will become more apparent by describing in detail a preferred embodiment thereof with reference to the attached drawings in which.

2

Figure 6:
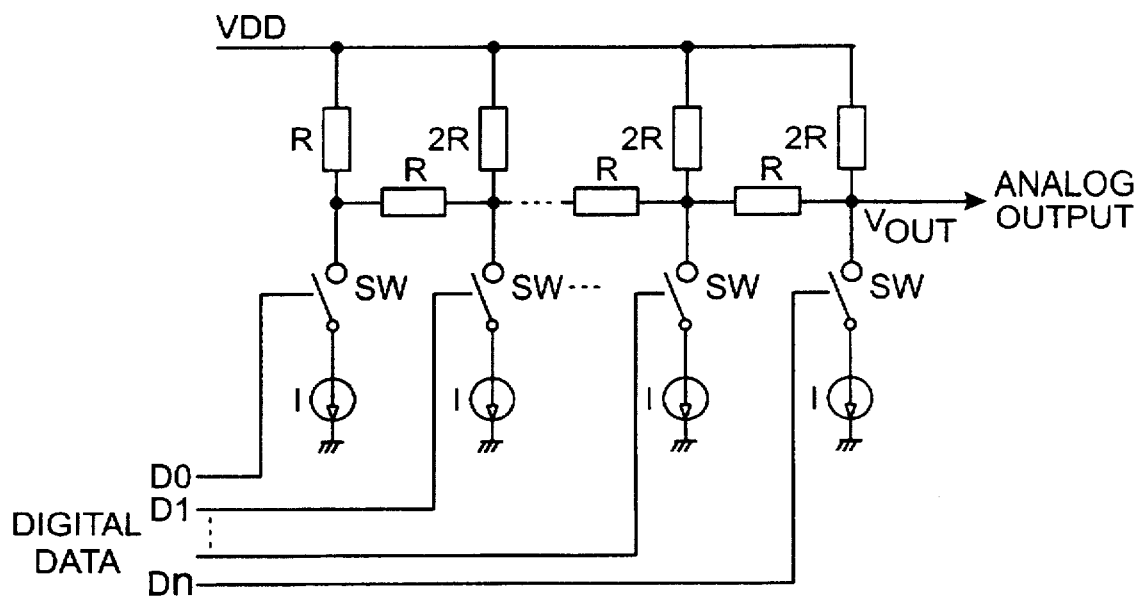

FIG. 6 is a circuit diagram of a general digital-to-analog converter having an R-2R ladder layout, which can be applied to the present invention.

DETAILED DESCRIPTION OF THE INVENTION

Figure 1:
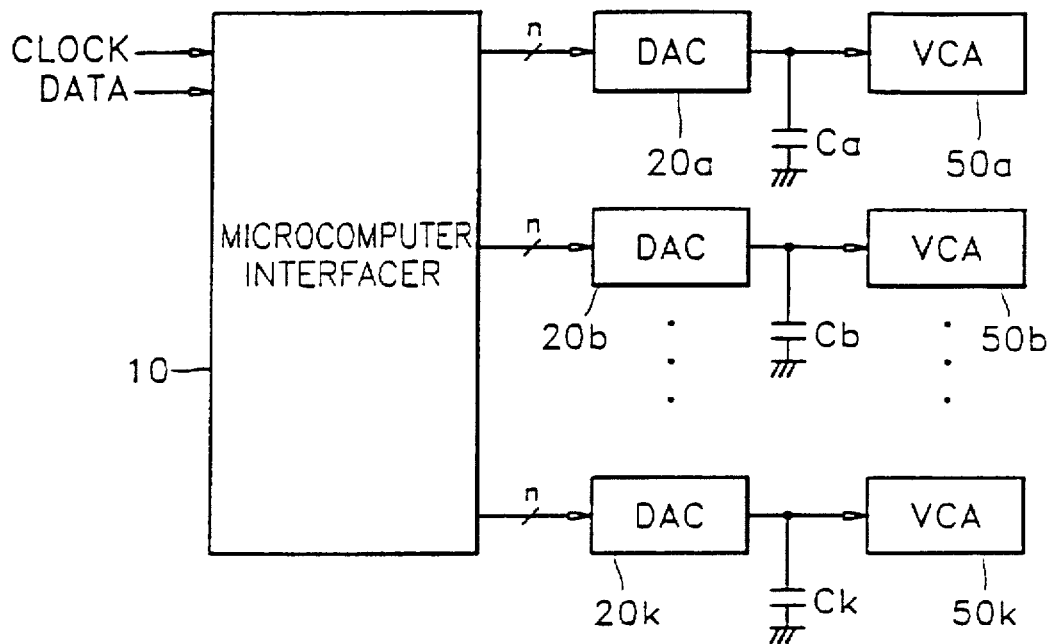
FIG. 1 is a schematic block diagram of a conventional digital data level control circuit.
Figures 2A, 2B:
FIGS. 2A and 2B are waveforms showing output voltages from a digital data level control circuit with and without the capacitors of FIG. 1, respectively.

According to a conventional digital data level control mode, digital data and various control signals output from a microcomputer are applied to corresponding digital-to-analog converters (DACs) $20a$, $20b$, ...., $20k$ via a microcomputer interfacer 10 as shown in FIG. 1. The applied digital data having the staircase waveform shown in FIG. 2A is controlled or filtered by using capacitors $C_a$, $C_b$, ...., $C_k$ at each output end of the DACs $20a$–$20k$, to output the smooth waveform shown in FIG. 2B. That is, the popcorn (POP) noise generated during the data conversion is removed. However, in the conventional art of FIG. 1, the number of capacitors connected to the output ends of the DACs are increased as the number of parameters to be controlled, such as volume, tone, balance increases.

Figure 3:
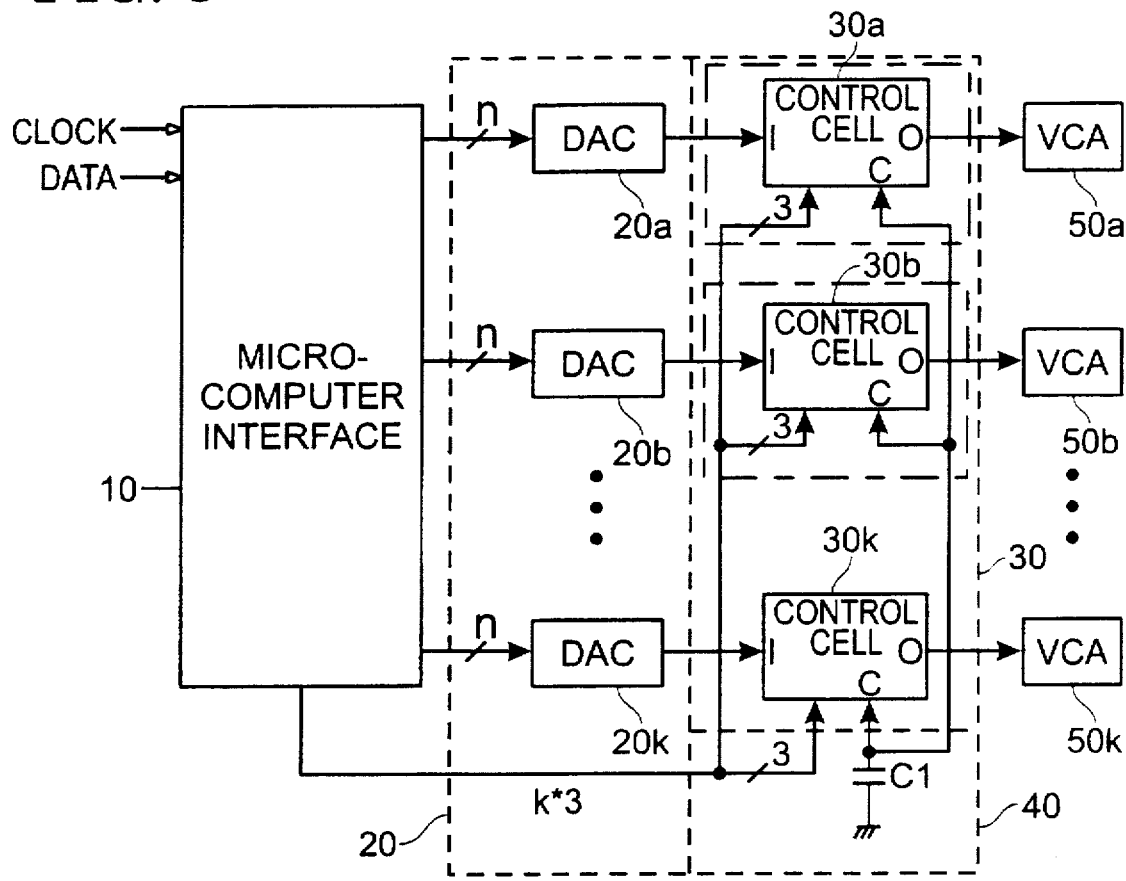
FIG. 3 is a schematic block diagram of a digital data level control circuit according to the present invention.

To solve the above problem, a digital data level control circuit of the present invention has the layout shown in FIG. 3. Referring to FIG. 3, the digital data level control circuit adopting a digital-to-analog conversion control mode for controlling levels of various parameters responsive to the digital data includes a microcomputer interfacer 10 for interfacing digital data and a control signal (clock) output from a microcomputer (not shown), a digital-to-analog converter (DAC) portion 20 for converting the digital data output from the microcomputer interfacer 10 to analog data, a controller 30 connected to the output ends of the DAC portion 20, for controlling the output of the analog-converted data by receiving a control signal k of the microcomputer interfacer 10, and output level control means 40 connected to one end of the controller 30, for controlling the level of the outputs from the DAC portion 20. Here, the output level control means 40 is connected to voltage control amplifiers (VCA) $50a$, $50b$, ...., $50k$. Here, preferably, the output level control means 40 as a capacitor C1 for controlling the levels of the outputs from the DAC portion 20 controls the levels of signals according to a time constant RC1 obtained from the capacitance of the capacitor C1 and the resistance of a resistor R of the corresponding controller 30.

Also, various types of DACs may be used for converting digital data into analog data. Particularly, a DAC having a ladder layout (R-2R LADDER) comprised of resistors R and 2R as shown in FIG. 6 is used in the present invention. According to this DAC, a linear output characteristic by which the POP noise is removed can be obtained by simply connecting an appropriate capacitor to the output end. As shown in FIG. 6, the digital signal is converted into an analog signal by a current source (I) activated by switches (SW), each of which is switched by sequentially receiving the digital data D0, D1, ...., Dn, and a combined resistance by the R-2R ladder layout. A detailed operational description of the conversion step will be omitted since the conversion step is well known to those skilled in the art.

Figure 4:
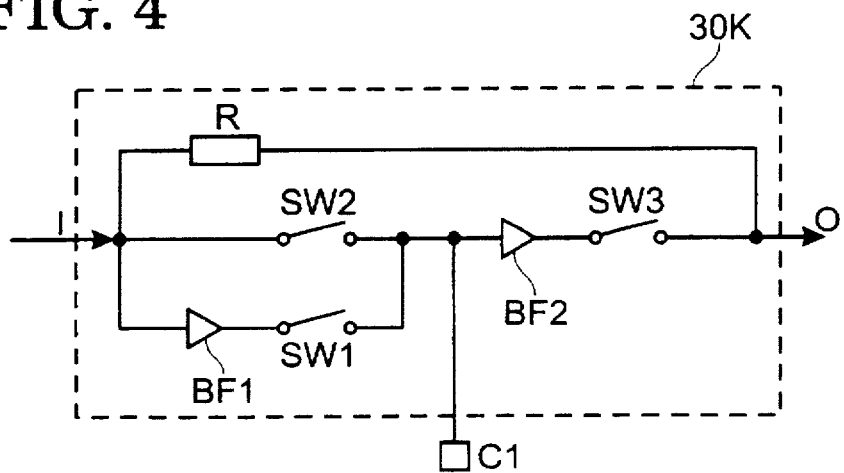
FIG. 4 is a detailed circuit diagram of a control cell within the control circuit shown in FIG. 3.

The characteristic feature of the digital data level control circuit of the present invention shown in FIG. 3 is that a controller 30 having a plurality of control cells, a control cell being shown in FIG. 4, is added for using only one capacitor between the DAC and the VCA, unlike the conventional digital data control circuit having a capacitor for removing the POP noise at the output end of each DAC. Each control cell $30k$ includes switches SW1, SW2 and SW3 which transmit data buffered by buffers BF1 and BF2 to the corresponding VCA 50k under the control of the microcomputer interfacer 10.

To describe the operation of the present invention in greater detail, the operation in which the VCAs 50a and 50b are respectively controlled by the control cells 30a and 30b in accordance with a control signal timing diagram of FIG. 5 will be described.

Figure 5:
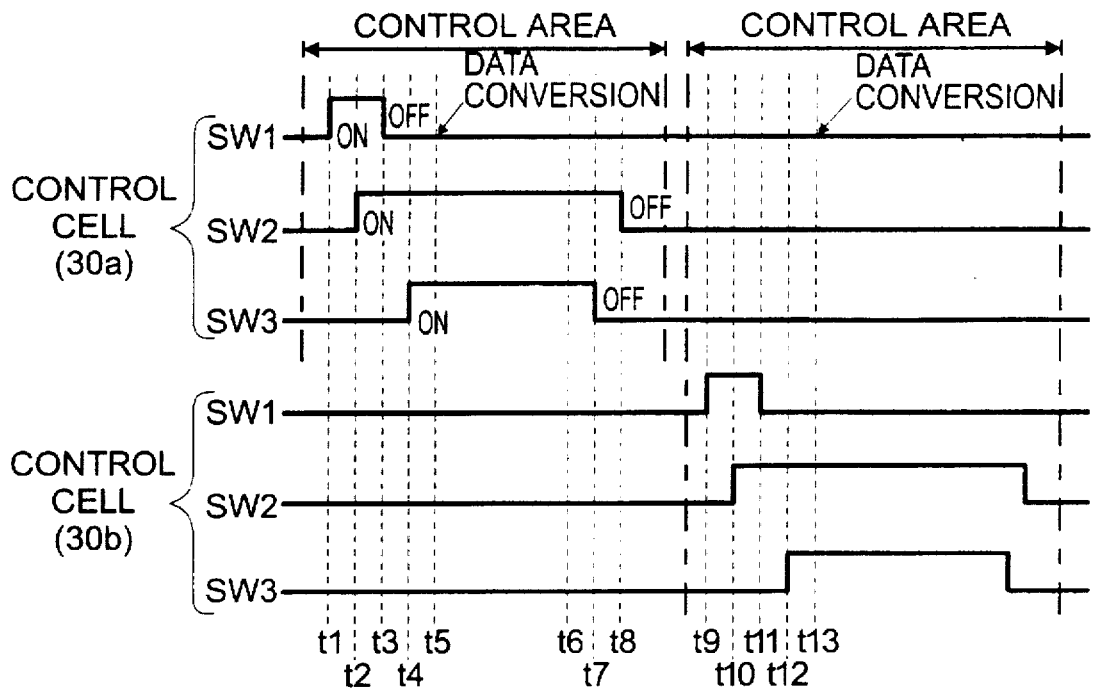
FIG. 5 is a timing diagram of control signals output from the microcomputer interfacer shown in FIG. 3.

When the input voltage of the VCA 50a is to be controlled from aV to a+a1V by a microcomputer (not shown) under the assumption that initial output voltages of the DACs 20a and 20b are aV and bV, respectively, a control signal shown in FIG. 5 is transmitted to the control cell 30a from the microcomputer interfacer 10.

First, while a first switch SW1 of FIG. 4 is turned on (here, the second and third switches SW2 and SW3 are "off"), aV is applied to the capacitor C1. As a result, the second switch SW2 is turned on and the first switch SW1 is turned off, maintaining aV at the capacitor C1 at its present level. Then, after the third switch SW3 is turned on to receive the data, the DAC 20a converts the data into the analog data under the control of the microcomputer interfacer 10. Then, the input voltage of the VCA 50a smoothly changes from aV to a+a1V according to a time constant RC1 obtained from the resistance of the resistor R of the control cells 30a, 30b, . . . , 30k and the capacitance of the capacitor C1.

When the input voltage of the VCA 50b is to be controlled from bV to b+b1V in the above state, the microcomputer interfacer 10 transmits a control signal to the control cell 30a to sequentially turn off the second and third switches SW2 and SW3. As a result, the output voltage of the control cell 30a is maintained at a+a1V. Then, the microcomputer interfacer 10 transmits a control signal to the control cell 30b to turn on the first switch SW1 of the control cell 30b. Accordingly, the output voltage bV of the DAC 20b is transmitted to the capacitor C1 to then turn on the second and third switches SW1 and SW3 and turn off the first switch SW1. Then, when the DAC 20b is controlled, the input voltage of the VCA 50b is smoothly changed from bV to b+bV by the time constant RC1 obtained from the resistor R of the control cells 30b, 30b, . . . , 30k and the capacitor C1.

When there is a VCA to be controlled as described above, a turn-off signal is sequentially applied to the second and third switches SW2 and SW3 of the control cell of the previously controlled VCA to maintain the control voltage of the VCA at its present level. Then, a turn-on signal is transmitted to the first switch SW1 of the control cell corresponding to the VCA to be controlled, and the previous output voltage of the corresponding DAC is then transmitted to the capacitor C1. Thereafter, the second switch SW2 of the control cell is turned on, the first switch SW1 thereof is turned off and then the third switch SW3 thereof is turned on, so that the output voltage from the DAC having a smooth waveform is obtained. That is, the POP noise generated when the level of the digital data is controlled can be removed.

As described above, according to the digital data level control circuit adopting a digital-to-analog conversion control mode of the present invention, a capacitor for removing POP noise is used towards the output end of a DAC portion and switching of a controller is controlled by a microcomputer to perform a desired level control, thereby effectively removing the POP noise and simultaneously improving the conventional defect in that an external capacitor for removing the POP noise, adopting the digital-to-analog conversion control mode, should be connected to the output ends of each DAC portion.

The present invention is not limited to the particular form illustrated and further modifications and alterations will occur to those skilled in the art.

What is claimed is:

1. A digital data level control circuit adopting a digital-to-analog conversion control mode for controlling the voltage level of an output parameter responsive to digital input data provided by a microcomputer, said digital data level control circuit comprising:

digital-to-analog converter means for converting said digital input data into analog data;

a controller connected to an output end of said digital-to-analog converter means, for controlling the level of the analog data; and output level control means coupled to said controller, for smoothly controlling the level of the analog output from said digital-to-analog converter means wherein the number of digital-to-analog converters in said digital-to-analog converter means is the same as the number of data applied from said microcomputer.

2. A digital data level control circuit according to claim 1, wherein said controller includes a plurality of control cells, each control cell arranged to receive a corresponding analog signal applied from a corresponding one of said digital-to-analog converters and controlling the level of the output thereof.

3. A digital data level control circuit according to claim 2, wherein said output level control means comprises a single capacitor controllably switched among the control cells.

4. A digital data level control circuit according to claim 2, wherein each said control cell comprises:

a first switch disposed for receiving the output from a corresponding digital-to-analog converter of said digital-to-analog converter means under the control of said microcomputer;

a first buffer for buffering the output from said corresponding digital-to-analog converter;

a resistor having one end connected to the output end of said corresponding digital-to-analog converter and the other end connected to the output of the control cell;

a second switch disposed for receiving the output from said first buffer under the control of said microcomputer;

a second buffer for buffering the output signal of said first or second switch; and a third switch disposed for receiving the output from said second buffer to output the output from said second buffer to the output end of said control cell, wherein said output level control means is connected to the input end of said second buffer.

5. A digital data level control circuit as claimed in claim 4, wherein said first switch is turned off, said second switch is turned on and the said third switch is turned on to remove popcorn (POP) noise generated from said resistor in said controller.

6. A digital data level control circuit as claimed in claim 4, wherein said resistor operates as an input means of said voltage control amplifier.

7. A method of providing smooth analog voltage transitions to a plurality of voltage-controlled amplifiers from a corresponding plurality of digital-to-analog converters, the method comprising:

providing a single filter capacitor for filtering the analog voltages output from the digital-to-analog converters;

selectively coupling the filter capacitor to a first one of the analog output voltages during a transition of said first analog output voltage from a first voltage level to a second voltage level;

isolating the filter capacitor from said first one of the analog output voltages; and then selectively coupling the filter capacitor to a second one of the analog output voltages during a transition of the second analog output voltage from a first voltage level to a second voltage level, thereby effectively sharing the single filter capacitor as needed.

8. A method according to claim 7 wherein said coupling the single filter capacitor to the first analog DAC output includes providing a control cell for each of the DACs and including a predetermined resistance element R in each of the control cells, and wherein said coupling the single filter capacitor to said first analog DAC output includes switching the resistance R into a series connection between the DAC output and the filter capacitor.

9. A method according to claim 10 wherein said isolating the single filter capacitor from the first analog DAC output includes opening a first switch between the DAC output and the filter capacitor and opening a second switch between the filter capacitor and the corresponding voltage-controlled amplifier.

10. A system for digital control of a plurality of adjustable parameters comprising:

digital input means for providing a plurality of digital control words, each digital control word representing a value for setting a corresponding one of the adjustable parameters;

a plurality of digital-to-analog converters, each digital-to-analog converter connected to receive a corresponding one of the digital control words for converting the corresponding digital control word to an analog voltage level;

a plurality of control cells, each control cell connected to the output of a corresponding one of the digital-to-analog converters for filtering the analog voltage level to smooth transitions in the analog voltage level resulting from changes in the corresponding digital control word;

a single filter capacitor; and switching means for controllably coupling the filter capacitor to each of the control cells, one control cell at a time, for smoothing transitions in the corresponding analog voltage level.

11. A system according to claim 10 wherein the digital input means comprises a microcomputer interfacer.

12. A system according to claim 10 wherein each control cell comprises:

an input terminal for receiving the corresponding DAC output analog voltage level;

a first switch connected between the input terminal and a capacitor node;

a second switch connected between the capacitor node and an output node; and a resistor connected between the input node and the output node, so as to form an RC low-pass filter for filtering the analog voltage when a filter capacitor is connected to the capacitor node and the first switch is open-circuit and the second switch is closed-circuit.

* * * * *